United States Patent [19]

Fombellida

[11] Patent Number: 4,797,610
[45] Date of Patent: Jan. 10, 1989

[54] ELECTRONIC TEST FIXTURE

[76] Inventor: Miguel Fombellida, 905-371 Gilmour St., Ottawa, Canada, K2P 0R1

[21] Appl. No.: 860,891

[22] Filed: May 8, 1986

[51] Int. Cl.⁴ ...................... G01R 31/02; G01R 31/28
[52] U.S. Cl. ............................ 324/158 F; 324/73 PC; 324/158 P
[58] Field of Search ........... 324/158 F, 158 P, 73 PC, 324/72.5

[56] References Cited

U.S. PATENT DOCUMENTS

| | | | |
|---|---|---|---|
| 3,714,572 | 1/1973 | Ham et al. | 324/158 F |
| 4,092,593 | 5/1978 | Wolk | 324/73 PC |
| 4,099,120 | 7/1978 | Aksu | 324/158 F |

Primary Examiner—Ernest F. Karlsen

[57] ABSTRACT

A fixture for testing circuit boards is provided with index pins that lift the circuit board into position for testing by contact probes. The index pins and contact probes may be mounted in a separately demountable cassette. The use of the cassette system allows relaxation of manufacturing tolerance demands.

16 Claims, 4 Drawing Sheets

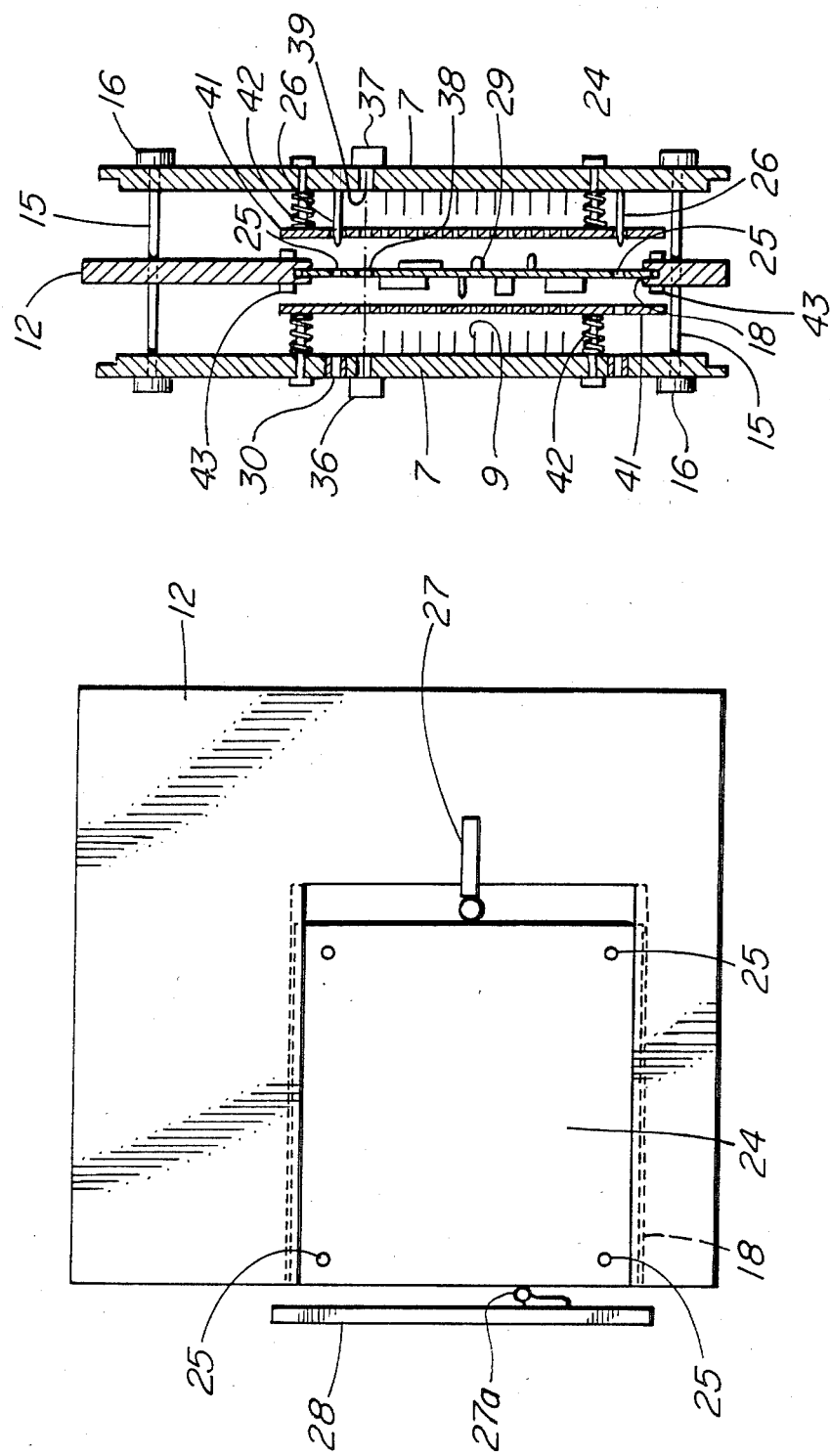

ELECTRONIC TEST FIXTURE

FIELD OF THE INVENTION

This invention relates to a device for testing electrical circuit boards. More particularly, it relates to a structure which provides for the ready mounting of circuit boards in a test fixture, and adaptation of that fixture to accommodate a variety of circuit boards for testing.

BACKGROUND TO THE INVENTION

In the testing of circuit boards, and particularly printed circuit boards, it is necessary to simultaneously contact numerous points on the circuit boards with electrically conductive probe-pins, mounted collectively on a probe plate, and make satisfactory electrical contact with the electrical components on the circuit boards. This has customarily been accomplished in the past by using a vacuum to depress the circuit board into a "bed of nails"-type array of electrical probes. Once all necessary electrical contacts are effected, separate electrical circuitry carries out the analysis to determine if the board is operating correctly.

Another method of engaging the electrical contacting probe-pins in a testing fixture is to apply simultaneously opposed arrays of probes to both sides of a board under test. Relatively balanced forces must be applied to the board from opposed sides to ensure there is no undue deflection from the pressure of the contacting probes. If necessary, dummy probes are used to ensure that a balance of forces is obtained.

For every specific circuit board design, it is necessary to have a corresponding probe plate that carries precisely placed probe-pins that are aligned with predetermined contact points on components that are mounted on the circuit board. In high volume testing situations it may be necessary to change probe plates on short notice and with a minimal interruption of the flow of circuit boards being tested.

The fixture should also be capable of receiving circuit boards with a minimum of delay, handling and adjustment, while at the same time providing accurate and precise placement of the board within the fixture.

One test fixture of existing in the prior art provides for the testing of circuit boards between pairs of vertical probe plates which are pneumatically closed on the subject board from both sides. Inward displacement of the probe plates is effected by pressure plates mounted on linear bearings, which, in their activating linkages and power cylinder, constitute a pressure frame within the fixture.

In the prior art, the probe plates are installed individually in the fixture during the set-up process. This procedure produces complications discussed further, below. In the operation of the prior art fixture, a board is placed in a protruding receiving frame which serves as a carrier to facilitate insertion of the board into the machine. Once the board is placed within the carrier, the carrier is drawn into the machine by a pneumatic cylinder.

In all machines of this class it is essential to make provision to ensure ultimately that tooling or index pins on the probe plates are aligned with index holes formed within the board. The index holes in a circuit board are precisely located holes from which components on the circuit board are precisely located. Similarly, the index pins on the probe plates (and their counterpart receiving holes on the opposing probe plates) are precisely located with respect to the probe-pins on the probe plates. If all of these parts are properly aligned, the probe pins will contact all of the components correctly during the testing process.

In the prior art different probe plates (to accommodate different circuit boards) must be individually mounted, and aligned, within the main frame of the test fixture. This is customarily done while the test fixture is located on the shop floor, along the production/testing line. The probe plates themselves must be precisely aligned with each other. Since, in the prior art, the probe plates are interconnected through their individual pressure plates and interconnecting bearings within the fixture, all of these components forming an exterior loop must be precisely manufactured to exacting tolerances.

The high precision required to ensure the precise placement of the probe plates imposes significant demands on the machining accuracy of the components involved. Every component interposed between the probe plates contributes towards an accumulation of variances due to individual tolerances. The number of components used in the prior art system described imposes costly manufacturing tolerance standards on each element and contributes to unreliability.

In the prior art the procedure for mounting the probe plates individually in the main frame of the test fixture, while the testing fixture is on the testing line, disrupts production.

SUMMARY OF THE INVENTION

Accordingly the invention overcomes some of the disadvantage cited by providing a structure which permits a circuit board to be placed directly in the fixture between two vertically positioned probe plates whereupon it is automatically aligned. The invention further permits the changing of probe plates in a convenient manner and use of a structure that ensures more precise alignment of the probe plate without placing exacting demands on machining of certain components of the fixture.

By one feature of the invention, the probe plates and circuit board receiving elements of an electrical test fixture are mounted in a cassette that may be separably mounted and connected within the pressure frame of the fixture and is readily interchangeable. The probe plates are inwardly displaceable on linear bearings along shafts directly interconnecting the probe plates are carried on a central cassette "C" frame into which a circuit board may be inserted along receiving tracks into approximate alignment with the index pins on the probe plates.

By another feature of the invention a fixture is provided with two insertion tracks between which a circuit board may be slid in a vertical orientation and within which the circuit board fits loosely. Initial positioning means place the board at a point within the insertion tracks whereby two tapered index pins, mounted either on one or on alternate probe plates, are targeted within the central region of the upper half of the two reference or index holes within the circuit board. Upon activation of the displacement mechanism that closes the probe plates on the circuit board, the index pins pass through the reference holes and hold the circuit board in precise alignment with the probe plates. Because the index pins are initially aligned so as to be targeted on a region of the reference holes that is above the center line for such holes, the circuit board is lifted slightly as the index pins pass through the reference holes. This features ensures that the boards are free-floating on the index pins and provides forgiveness for variations in tolerances of the insertion tracks and initial positioning means.

By a further feature of the invention the initial positioning means comprises a resilient stop means mounted at the end of the insertion track in combination with a positioning cam, mounted on a door that may be closed once the circuit board is inserted in the fixture. The resilient stop means thrusts the board once inserted, against the positioning cam which has been calibrated to place the reference holes in approximate alignment with the index pins.

By a further feature of the invention where the circuit board is held endwise between a positioning cam and a resilient stop means, the index pins are targeted on the central region of the upper quadrant of the reference holes in the circuit board closest to the resilient stop means.

An interlock may optionally be installed to prevent closure of the probe plates in the event that the door is not fully closed. Alternately, the mechanism for moving the probe plates may be activated by the closure of the door and an automatic latch may then be engaged while the test cycle is being carried out.

By a further feature of the invention, the probes on the probe plates are concealed between "nest plates" which protect the pins from being touched inadvertently when the probe plates are in the retracted position. At the same time, precisely placed holes in the nest plates allow the probe pins to pass therethrough on closure of the probe plates.

Accordingly, by means of these, and further features described, this invention provides a convenient and reliable means for testing electronic circuit boards of varying types. A more detailed description of a preferred embodiment of features of the invention now follows.

BRIEF SUMMARY OF THE DRAWINGS

In the drawings:

FIGS. 2 and 3 are aligned to indicate the manner in which the cassette of Fixture 2 may be slid into the pressure frame of FIG. 3.

FIG. 4 is a side view of the cassette "C" frame with a printed circuit board held in position between the door mounted positioning means and the interior resilient stop means.

FIG. 5 is an end view of a circuit board in position between two probe plates.

DESCRIPTION OF THE PREFERRED EMBODIMENT

Figure 1:
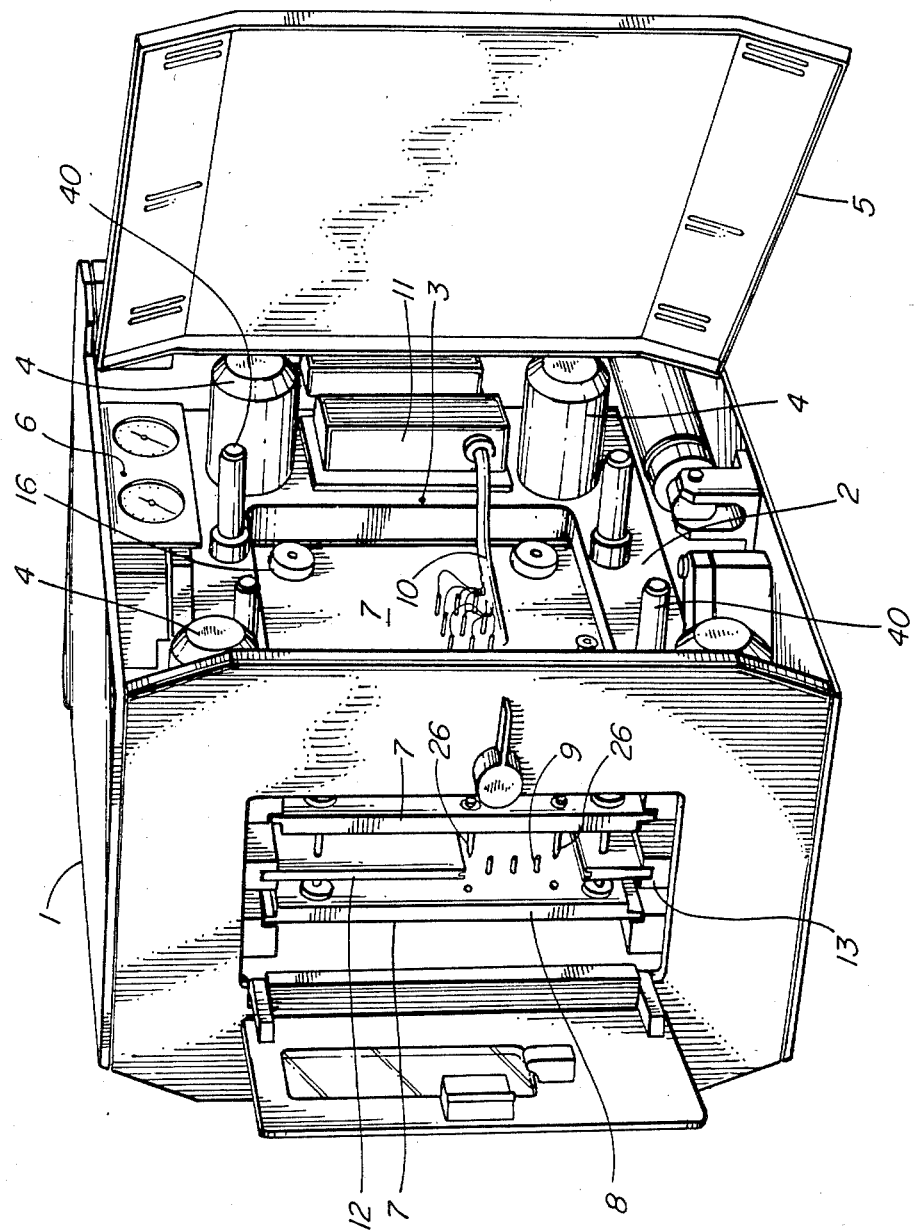
FIG. 1 shows a perspective view of a fixturing structure mounted in a case and with one of the side access doors open for inspection.

The fixture system comprising the invention and as depicted in FIG. 1 is mounted in a case 1. Lateral doors 5, on either side may be opened to obtain access to the interior. Within the case 1 is mounted the pressure frame 2 composed of pressure plates 3 mounted on linear bearings 4. The inward movement of the pressure plates 3 is effected by a pneumatic cylinder (not shown) and controlled and monitored by an electrically activated controller 6.

Probe plates 7 are mounted within a cassette 8 that places the probe plates 7 within the pressure frame 2. The probe pins 9 on the probe plates 7 are wired electrically through a harness 10 to a plug connector 11 which interfaces with the electrical test system (not shown).

The cassette 8 carrying the probe plates 7 also includes the centrally located cassette "C" frame 12 within which a circuit board (not shown in FIG. 1) may be mounted. The cassette "C" frame 12 rests within a central main frame "C" plate 13.

Figure 2:
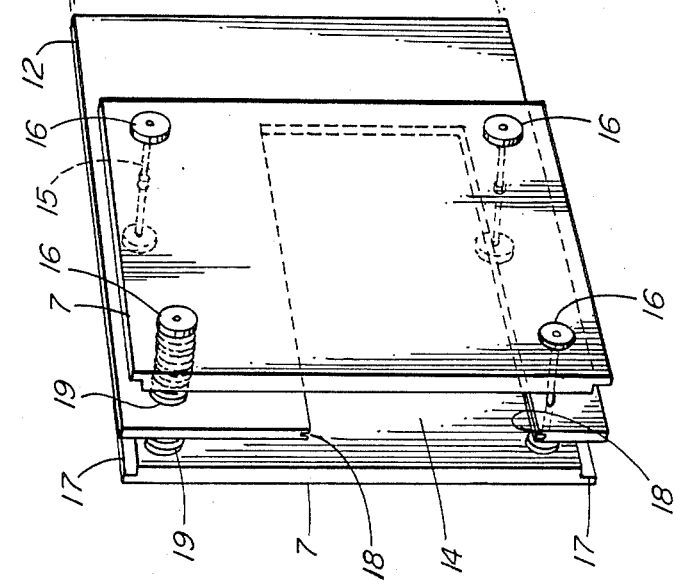
FIG. 2 shows a perspective view of a cassette carrying two probe plates.
Figure 8:
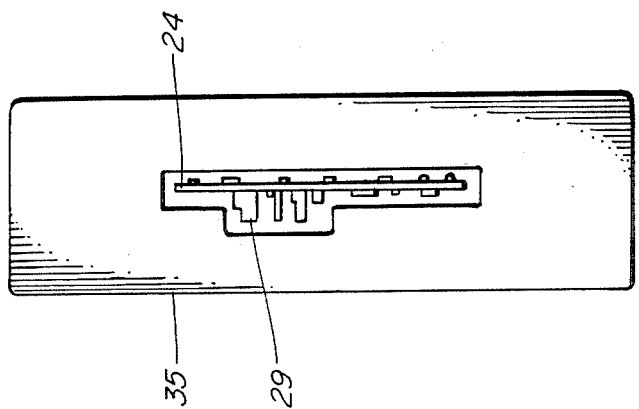
FIG. 8 is a face view of a cover plate over the end of a cassette having an asymetrical circuit board insertion hole formed therein.

The cassette 8 for carrying the probe plates 7 and receiving the circuit board is shown separately in FIG. 2.

In FIG. 2 the central cassette "C" frame 12 has an opening 14 to receive a circuit board. Mounted on the cassette "C" frame 12 are shafts 15 which extend out to the probe plates 7. The shafts 15 enter the probe plates 7 along linear bearings 16 mounted in the probe plates. The upper and lower edges 17 of the probe plates 7 may optionally be grooved to facilitate their being clamped to the pressure plates within the fixture.

The upper and lower inner edges 18 of the opening 14 within the cassette "C" frame 12 are grooved to form tracks or guides within which a circuit board may be slid. Each cassette "C" frame 12 is individually fabricated to the precise size necessary to loosely receive a specific circuit board within the opening 14.

Springs 19 (of which only one set is shown) may be placed on the shafts 15 to keep the probe plates 7 apart when no pressure is being applied to them.

Figure 3:
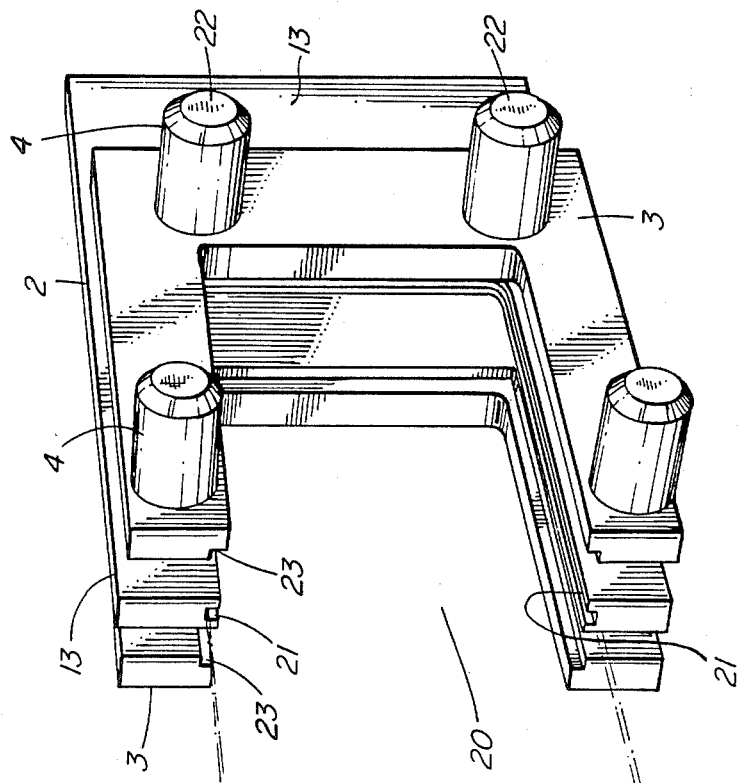
FIG. 3 shows a perspective view of a portion of the pressure frame within a fixture that is adapted to receive a cassette.

A portion of the pressure frame 2 within which the cassette 8 slides is shown in FIG. 3. The pressure plates 3 are mounted on opposed sides of the main fixture "C" frame, or main frame 13. The opening 20 within the main frame 13 is grooved along its inner upper and lower edges 21 to receive the cassette "C" frame 12. Shafts 22 shown mounted on one side of the main frame 13 pass into the pressure plates 3 through linear bearings 4. The shafts 22 pass through the main frame 13 and into linear bearings (not shown) within the opposing pressure plate 3. The inside edges 23 of the pressure plates 3 are equipped with tracks to receive the probe plates.

Clamps (not shown) accessed by clamping posts 40 (shown in FIG. 1 but omitted for clarity from FIG. 3) that pass through holes in the pressure plates 3 may be used to hold the probe plates 7 against the pressure plates 3. This will also assist in the retraction of the probe plates when the pressure plates 7 are withdrawn pneumatically.

The cassette "C" frame 12 is also clamped to the main frame 2 along the upper and lower edges 21 of the main frame 13. The clamping force both at the cassette "C" frame 12 and along the probe plates 7 may be kept sufficiently low so as to permit movement and relieve stress in the event that the shafts 22 of the main frame 13 and shafts 15 of the cassette "C" frame 12 are not precisely aligned. This is an alternative to the use of self-aligning linear bearings.

The mounting of a circuit board 24 within the cassette "C" frame 12 is shown in side view in FIG. 4.

The reference holes 25 of the circuit board 24 are generally formed in the corners of the board. The primary and secondary reference holes are customarily mounted in diagonally opposite corners. But additional holes, if precisely drilled, may be made in other corners as well.

The board 24 sits lightly in the cassette "C" frame tracks along the edges 18. At the rear of the cassette opening 14, a resilient positioning or stop means 27 (which is preferably a roller mounted on either a pneumatic or mechanical spring) bears against the inward edge of the circuit board 24. At the other end of the circuit board 24, a positioning cam 27a with roller contact, conveniently mounted on a door 28, presses the board 24 into the resilient stop means 27. The use of rollers allows the board freedom to adjust its position vertically. The cam 27a and resilient stop means 27 may be interchanged to still obtain the same positioning effect.

The probe plates bear index pins 26, shown in the end view of the cassette assembly depicted in FIG. 5. The probe pins 9, board components 29, as well as nest plates 41 are also shown in this view.

The index pins 26 in the probe plates 7 are aligned through the cassette shafts 15 and linear bearings 16 with complementary receiving holes 30 on the opposing probe plate 7. Two index pins 26 are shown mounted on the same probe plate 7. This is optional and each probe plate 7 could carry both a pin 26 and hole 30.

Figure 6:
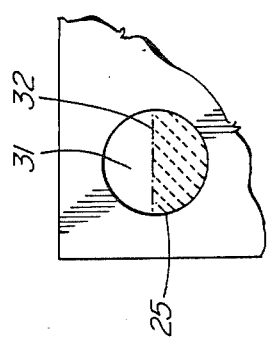
FIG. 6 is a schematic drawing of the target zone within the circuit board reference hole on which the probe plate index pins are aligned.
Figure 7:
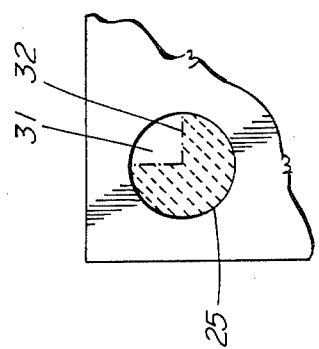
FIG. 7 is a schematic depiction of an alternate target zone to that depicted in FIG. 6.

When the probe plates 7 close, if the index pins 26 are sufficiently aligned with the reference holes 25 on the circuit board 24, then the pins will pass through the circuit board reference holes 25 and be received by the probe plate receiving holes 30. It is not essential that the index pins 26 be exactly centered on the circuit board reference holes 25. In fact, it is desirable that the probe plate index pins 26 be designed, in conjunction with the cassette 8 and circuit board 24, so that the pins 26 are targeted on the central region of the upper half of the reference holes 25; and more preferably on the central region of the upper, inner quadrant of the reference holes 25 closest the resilient stop means 27. This is shown in FIGS. 6 and 7 respectively.

The concept of targeting the index pins 26 premises that there will inevitably be dimensional errors in the alignment of parts due to manufacturing tolerances. The cassette system described previously is intended to minimize the effects of cummulation of tolerances. The targeting of the index pins assumes the relative positions of components if there were no manufacturing errors. By targeting the index pins 26 on the upper half of the circuit board reference holes 25, the board 24 will be lifted off the cassette "C" frame guides 18 if the parts are perfectly aligned. The board will then be "floating" in position between the probe plates 7, supported only by the index pins 26. Two index pins are needed to ensure the precise location of the board 24 in this manner.

The description so far is based upon an embodiment in which the circuit board rests vertically, under gravity on the lower track edges 18. The board 24 is lifted off this supporting guide by the pins. The invention would also preform equivalently if the entire apparatus were rotated 90 degrees with the board 24 horizontally installed and if the effect of gravity were replaced by a resilient means, such as a spring, that biased the board to rest against the track 18 that was formerly beneath the circuit board 24. The targeting criteria for the index pins 26 remains the same, the board 24 being displaced from the guide 18, rather than lifted.

The index pins 26 must be targeted at a point 31, shown in FIG. 6, above the centerline 32 because if the pins 26 were targeted on the centerline 32, manufacturing errors might center the pins 26 in fact below the centerline 32. Since the circuit board 24 is supported by the inner lower edges 18 of the cassette "C" frame 12, there would be no means by which the circuit board 24 would be able to move down. The result might be that the index pins 26 would bend, causing a misalignment of the probe pins 9.

The above description assumes that the initial placement mechanism for the circuit board 24 is capable of ensuring that the board 24 is reliably placed within the target zone. When a resilient stop means 27 is used at one end of the circuit board 24, in conjunction with a relatively non-resilient positioning cam 27a located at the other end, it is desireable to target the index pins 26 on the upper quadrant of the reference holes 25 closest to the stop means 27. This is shown in FIG. 7, where the target point 31 has been placed in the upper quadrant of the reference holes 25. By so targeting the index pin 26, the system allows some forgiveness of manufacturing errors and prevents the board from being thrust by the index pins 26 into the non-resilient positioning cam. Put alternately, the board 24 is both lifted upwardly by the index pins 26, and inwardly towards the stop means 27, if everything is perfectly aligned. Slight misalignments may simply reduce or increase the precise amount of displacement involved and scope for such misalignments has been provided by the targeting concept described.

The procedure by which the cassette (with probe plates) is mounted in the fixture is as follows:

(1) a dummy circuit board is installed in the cassette in a position where the index pins on the probe plates are aligned with and will pierce the reference holes on the dummy circuit board upon closing of the probe plate;

(2) the cassette is inserted into the central supporting "C" mainframe of the fixture without being clamped in position;

(3) the probe plates are displaced inwardly until two index pins on probe plates are engaged with the receiving holes on the opposing probe plate, supporting the dummy circuit board therebetween;

(4) the positioning cam (which may be carried by a door) is brought to bear against the circuit board so as to slide the board and entire cassette into position within the pressure frame;

(5) the cassette "C" frame may then be lightly clamped to the central supporting main frame (with enough forgiveness to accommodate slight non-alignment between the pressure plate and the probe-plate shafts and linear bearings), the probe plates may also be lightly clamped to the pressure plates if it is desired to use the pressure plates to retract the probe plates. This completes the cassette mounting process.

Where the positioning cam on the door is so non-resilient that it cannot accommodate a few thousandths of an inch of outward displacement of the test board, then a special dummy circuit board is used. This dummy circuit board has its reference holes displaced inwardly (towards the resilient stop means) by an amount which will cause the index pins to be targeted on the upper inner quadrant of the reference holes when a regular circuit board is inserted. The use of the dummy circuit board may be eliminated if the cassette is located precisely with respect to a reference point in the main frame and thereby to the positioning cam. A further alternative is to approximately locate the cassette in the main frame, and then provide the cam on the door with a vernier adjustment mechanism, which allows the cam to be adjusted to the correct point for placing a circuit board in position between the probe plates.

Since the circuit board is loosely mounted—"floating" somewhat, within the cassette "C" frame—it is sufficient that the cassette and locating cam are positioned in an approximately spaced relationship which simply ensures that the index pins are centered on the target of the reference holes in the circuit board. As long as the circuit board is sufficiently aligned with probe plate index pins the position of the cassette within the pressure plates is not critical.

A feature of this system is that the circuit board is relatively light to lift. The weight of circuit boards is well within the capacity of the relatively thin index pins to position the components. Thus the alignment system is not burdened with having to support additional weight as where a carrier or frame must be displaced as well, in order to align the circuit board.

Use of the cassette system, with its directly interconnected probe plates, does not impose the same stringent tolerance requirements on the pressure plate and displacement mechanism as a system in which the probe plates are aligned through an external loop constituted by the pressure plates and supporting structure within the mainframe of the fixture. Accurate alignment of the probe plates and central "C" frame within the cassette may easily be obtained during fabrication by drilling the holes in the probe plates for the index pins and the linear bearings with the plates laid one over the other.

The system constituted by the invention permits the preparation of probe plate assemblies for specific circuit boards to be assembled off the testing production line in cassette form. Lacking pressure plates, etc., the cassette is relatively light and therefore easily portable.

When it is desired to change the probe plates within a fixture to accommodate a new format circuit board, the old cassette is simply removed and the new one installed. the stroke or travel for the pressure plates is then adjusted to correspond to the new probe plates. This is a quick procedure that does not require critical alignments to be effected on the test line by a skilled technician.

Since the positioning of the cassette within the pressure frame of a fixture is simply calibrated on installation, cassettes will be generally interchangeable between various fixtures. Only the cassettes need be changed to accommodate different boards. The wiring harness can be used with a standard format zero-insertion-force multiple connector or "pogo" pin connector that fits any fixture.

The use of a cassette assembly also minimizes the risk that left and right hand probe plates will become mixed-up at the time of installation in the fixture.

If it is desired to check-out a cassette to determine whether all the probe pins are properly aligned, a special contact-testing board may be inserted. This board need not carry components but is provided with a wiring network and series of contact points that will verify the proper location of all probe pins. The verification is carried-out electrically by a special program in the electrical analysis aligned hole is formed in the opposing probe plate to allow a beam of light, or infra-red rays to pass therethrough into a detector 36 mounted on the opposing probe plate 7. The detector 36 controls an interlock (not shown) within the activation system of the pressure frame 2 with both the emitter 37 and detector 36 being connected through the wiring harness 10 to the controller 6.

Each circuit board 24 corresponding to given probe plates 7 may then have a characterising hole 38 formed therein which becomes specifically aligned with this beam when properly installed. The holes 39 in the probe plates 7, and the positions of the emitter 37 and detector 36, may be varied so as to allocate one particular hole position for each class of circuit board 24. If an erroneous board is inserted, its hole 38 will not likely correspond with the beam.

During the testing cycle, low pressure air activates the pneumatic cylinders and causes the pressure frame to start the procedure of closing the probe plates towards the circuit board. As a further precaution a pressure sensitive switch can abort this process if resistance is encountered at the moment that the index pins should be penetrating the index holes on the circuit board. This is an alternate system for preventing damage to the board and probe plates if the wrong board is installed.

If premature resistance is not encountered, the closure continues to a predetermined point when all probe pins are in electrical contact with their designated components and closures ceases. This effectively clamps the board in position, under the force of numerous opposed spring-loaded probe pins. Electrical testing may then be carried out. When this is concluded a "pass/fail" signal is indicated to the operator and the pressure plates retract, carrying the probe plates with them.

Upon complete retraction, the interlock on the door is released. Since the board has been pressed by the door-mounted positioning cam against a spring at its interior edge, the board will spontaneously partially self-eject upon opening the door. The operator may then remove the board and proceed to the next board to be tested.

To protect the pins on the probe plates from damage, the resilient stop means or spring may be fitted with an interlock that prevents closure of the plates when no circuit board is installed. As a further means of protections, "nest plates" 41 may be mounted on springs 42 between the probe plates 7 and the cassette "C" frame 12, just beyond the ends of the probe pins 9. Holes drilled in the nest plates 41 corresponding to the probe pins 9 then allow the probe pins 9 to pass therethrough on activation of the pressure plates 3. Until this occurs, the pins 9 remain shielded behind the nest plates 41. The springs 42 supporting the nest plates 41 allow the probe plates 7 to continue advancing inwardly, even after the nest plates have contacted stops 43 on the cassette central frame 12. This ensures that the probe pins 9 will pass through the holes in the nest plates 41.

Accordingly, the foregoing description has demonstrated an exemplary application of the invention. The full scope of the invention is its broadest and more specific aspects is further described and defined in the claims which now follow.

I claim:

1. An electronic test fixturing apparatus for testing a generally planar circuit board having two reference holes pierced transversely therethrough comprising:
   (1) circuit board support means within said apparatus, said support means being provided with first and second guide means adapted to receive and maintain said circuit board in a position between said guide means, said circuit board being biased to rest normally on said first guide means, but being loosely constrained and displaceable towards second guide means;
   (2) a pair of probe plates, each member of said pair being mounted on opposed sides of said circuit board when said circuit board is installed upon said support means, said plates carrying, collectively, a pair of inwardly directed parallel index pins and complementary index pin receiving holes; and
   (3) end positioning means adapted to approximately align said circuit board upon insertion on said support means so that said index pins are opposite said reference holes,
   wherein said index pins are targeted, under conditions of perfect alignment, within the central region of the upper half of said reference holes furthermost from said first guide means.

2. An electronic test fixturing apparatus as in claim 1 wherein said circuit board is installed in a vertical orientation and is biased to rest on said first guide means by gravity.

3. An electronic test fixturing apparatus as in claim 1 or 2 wherein said end positioning means comprises, in combination, a resilient positioning means at one end of said support means and a non-resilient positioning means at the other end of said support means and wherein said index pins are targeted within the central region of the upper quadrant of said reference holes closest to said resilient positioning means.

4. An electronic test fixture as in claim 2 in which a circuit board, when inserted in vertical orientation therein, on closure of the probe plates, is lifted and supported by said index pins.

5. An electronic test fixture as in claim 3 in which a circuit board, when inserted in vertical orientation therein, on closure of the probe plates, is lifted and supported by said index pins.

6. An electronic fixturing apparatus as in claim 1 or 2 wherein said end positioning means comprises, in combination:
   (1) a resilient positioning means mounted at the inner end of said support means; and
   (2) a two-position cam means mounted on said fixturing apparatus, said cam means being mounted in such a manner as to permit insertion of a circuit board when said cam is in an open position, and to permit said cam to bear against the end of said circuit board when said cam is in a closed position.

7. An electronic fixturing apparatus as in claim 6, wherein said cam is mounted on a door which seals-off access to the circuit board when said cam is in said closed position.

8. An electronic fixturing apparatus as in claim 7 wherein said fixturing apparatus carries a door interlock which prevents such apparatus from being activated in the event that said door is not fully closed.

9. An electronic test fixturing system as in claims 1 or 2 wherein a nest plate is interposed between one of said probe plates and said circuit board.

10. An electronic test fixturing system as in claims 1 or 2 wherein said guide means for supporting said circuit board are formed along the inner edges of a "C"-shaped opening within a central frame of a demountable cassette mounted within said fixture, said pair of probe plates being mounted within said cassette, on linear shafts extending perpendicularly outwardly from opposite sides of said central frame, said cassette being separately demountable from said fixture as a unit.

11. An electronic test fixturing system as in claims 3 wherein said guide means for supporting said circuit board are formed along the inner edges of a "C"-shaped opening within a central frame of a demountable cassette mounted within said fixture, said pair of probe plates being mounted within said cassette, on linear shafts extending perpendicularly outwardly from opposite sides of said central frame, said cassette being separately demountable from said fixture as a unit.

12. An electronic test fixturing system as in claims 4 wherein said guide means for supporting said circuit board are formed along the inner edges of a "C"-shaped opening within a central frame of a demountable cassette mounted within said fixture, said pair of probe plates being mounted within said cassette on linear shafts extending perpendicularly outwardly from opposite sides of said central frame, said cassette being separately demountable from said fixture as a unit.

13. An electronic test fixturing system as in claim 5 wherein said guide means for supporting said circuit board are formed along the inner edges of a "C"-shaped opening within a central frame of a demountable cassette mounted within said fixture, said pair of probe plates being mounted within said cassette on linear shafts extending perpendicularly outwardly from opposite sides of said central frame, said cassette being separately demountable from said fixture as a unit.

14. An electronic test fixturing system as in claim 6 wherein said guide means for supporting said circuit board are formed along the inner edges of a "C"-shaped opening within a central frame of a demountable cassette mounted within said fixture, said pair of probe plates being mounted within said cassette on linear shafts extending perpendicularly outwardly from opposite sides of said central frame, said cassette being separately demountable from said fixture as a unit.

15. An electronic test fixturing system as in claim 7 wherein said guide means for supporting said circuit board are formed along the inner edges of a "C"-shaped opening within a central frame of a demountable cassette mounted within said fixture, said pair of probe plates being mounted within said cassette on linear shafts extending perpendicularly outwardly from opposite sides of said central frame, said cassette being separately demountable from said fixture as a unit.

16. An electronic test fixturing system as in claim 8 wherein said guide means for supporting said circuit board are formed along the inner edges of a "C"-shaped opening within a central frame of a demountable cassette mounted within said fixture, said pair of probe plates being mounted within said cassette on linear shafts extending perpendicularly outwardly from opposite sides of said central frame, said cassette being separately demountable from said fixture as a unit.

* * * * *